United States Patent
Bogner et al.

(10) Patent No.: US 7,306,960 B2
(45) Date of Patent: Dec. 11, 2007

(54) HIGH RADIANCE LED CHIP AND A METHOD FOR PRODUCING SAME

(75) Inventors: Georg Bogner, Lappersdorf (DE); Siegmar Kugler, Regensburg (DE); Ernst Nirschl, Wenzenbach (DE); Raimund Oberschmid, Sinzing (DE); Karl-Heinz Schlereth, Burglengenfeld (DE); Olaf Schoenfeld, Regensburg (DE); Norbert Stath, Regensburg (DE); Gerald Neumann, Regensburg (DE)

(73) Assignee: Osram GmbH, Munich (DE)

( * ) Notice: Subject to any disclaimer, the term of this patent is extended or adjusted under 35 U.S.C. 154(b) by 0 days.

(21) Appl. No.: 11/311,809

(22) Filed: Dec. 19, 2005

(65) Prior Publication Data

US 2006/0138439 A1  Jun. 29, 2006

Related U.S. Application Data

(62) Division of application No. 10/258,154, filed as application No. PCT/DE01/01513 on Apr. 19, 2001, now Pat. No. 7,026,657.

(30) Foreign Application Priority Data

Apr. 19, 2000 (DE) .............................. 100 19 665

(51) Int. Cl.
*H01L 21/00* (2006.01)

(52) U.S. Cl. ............................ 438/22; 438/25; 438/27; 438/29; 257/E33.006; 257/E33.061; 257/E33.063; 257/E33.065; 257/E33.074

(58) Field of Classification Search ................. 438/22, 438/25, 27, 29; 257/94–95, 98–99
See application file for complete search history.

(56) References Cited

U.S. PATENT DOCUMENTS

| | | | |
|---|---|---|---|
| 3,593,055 A | 7/1971 | Geusic et al. | |
| 4,339,689 A | 7/1982 | Yamanaka et al. | |
| 4,700,210 A | 10/1987 | Burton et al. | |
| 5,087,949 A | 2/1992 | Haitz | |
| 5,233,204 A | 8/1993 | Fletcher et al. | |
| 5,264,715 A | 11/1993 | Guenter et al. | |
| 5,705,834 A | 1/1998 | Egalon et al. | |
| 2001/0000209 A1* | 4/2001 | Krames et al. | 257/94 |
| 2004/0012958 A1 | 1/2004 | Hashimoto et al. | |
| 2004/0056263 A1 | 3/2004 | Baur et al. | |
| 2005/0003565 A1* | 1/2005 | Eisert et al. | 438/22 |
| 2007/0012944 A1* | 1/2007 | Bader et al. | 257/103 |

FOREIGN PATENT DOCUMENTS

| | | |
|---|---|---|
| DE | 2421590 | 11/1975 |
| DE | 2536704 | 3/1976 |
| DE | 2633942 | 2/1978 |

(Continued)

Primary Examiner—A. Sefer
(74) Attorney, Agent, or Firm—Fish & Richardson P.C.

(57) ABSTRACT

The invention concerns a light-emitting diode chip comprising a radiation-emitting active region and a window layer. To increase the luminous efficiency, the cross-sectional area of the radiation-emitting active region is smaller than the cross-sectional area of the window layer available for the decoupling of light.

The invention is further directed to a method for fabricating a lens structure on the surface of a light-emitting component.

4 Claims, 4 Drawing Sheets

FOREIGN PATENT DOCUMENTS

| | | | |
|---|---|---|---|
| DE | 19911717 | * | 9/2000 |
| EP | 0101368 | | 2/1984 |
| EP | 0405757 | | 1/1991 |
| EP | 0562880 | | 9/1993 |
| EP | 0977280 | | 2/2000 |
| FR | 2531814 | | 2/1984 |
| GB | 2043340 | | 10/1980 |
| GB | 2326023 | | 12/1998 |
| JP | 59121985 | | 7/1984 |
| JP | 61125092 | | 6/1986 |
| JP | 6327087 | | 2/1988 |
| JP | 02113524 | | 4/1990 |
| JP | 02119275 | | 7/1990 |
| JP | 08255933 | | 10/1996 |
| WO | WO 96/37000 | | 11/1996 |
| WO | WO 99/00851 | | 1/1999 |

* cited by examiner

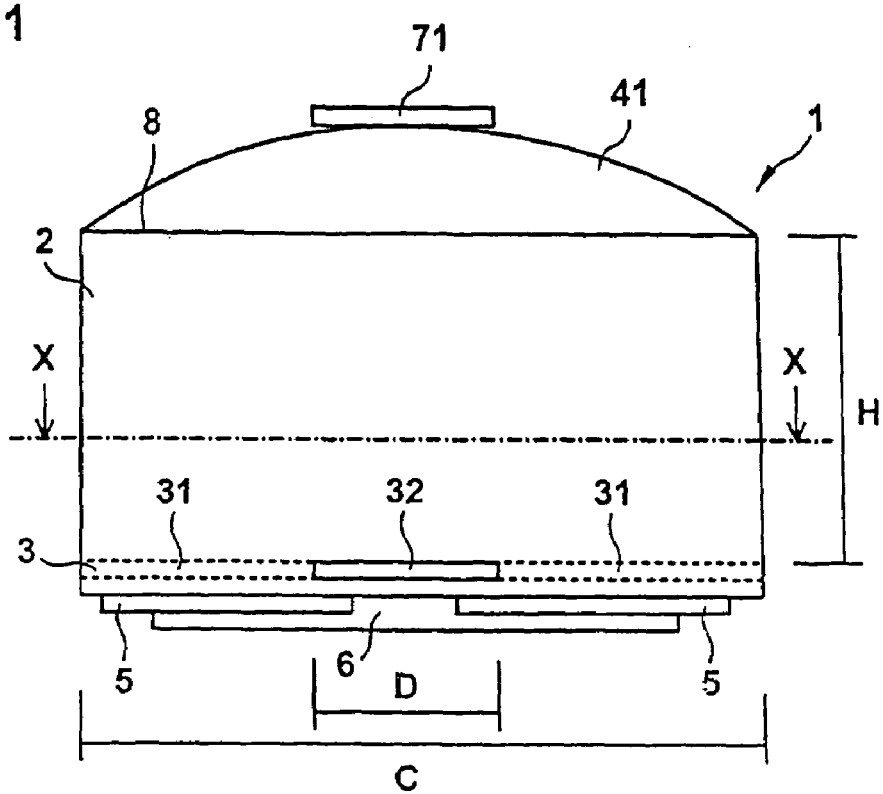
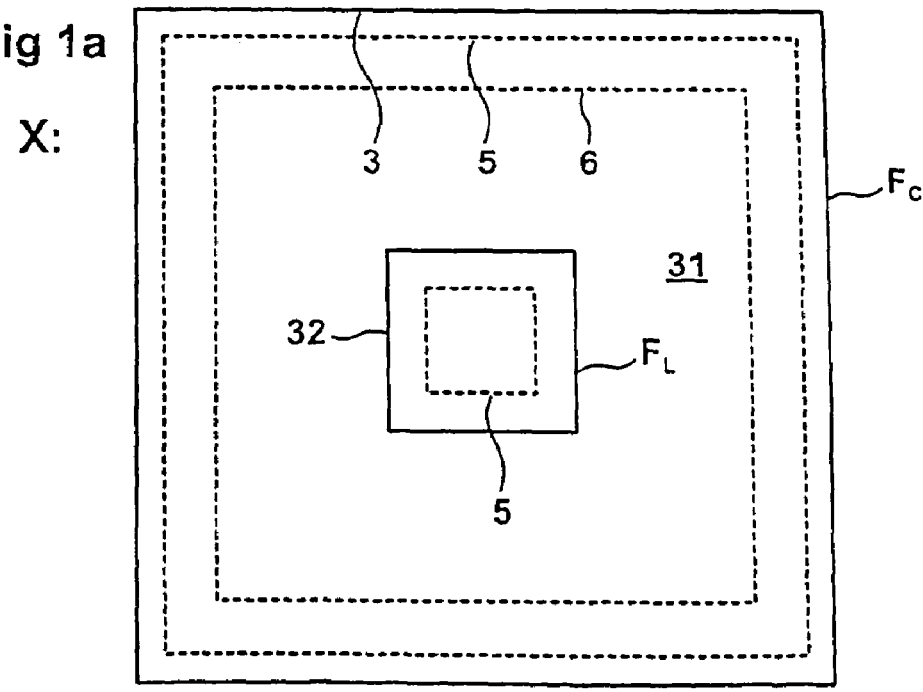

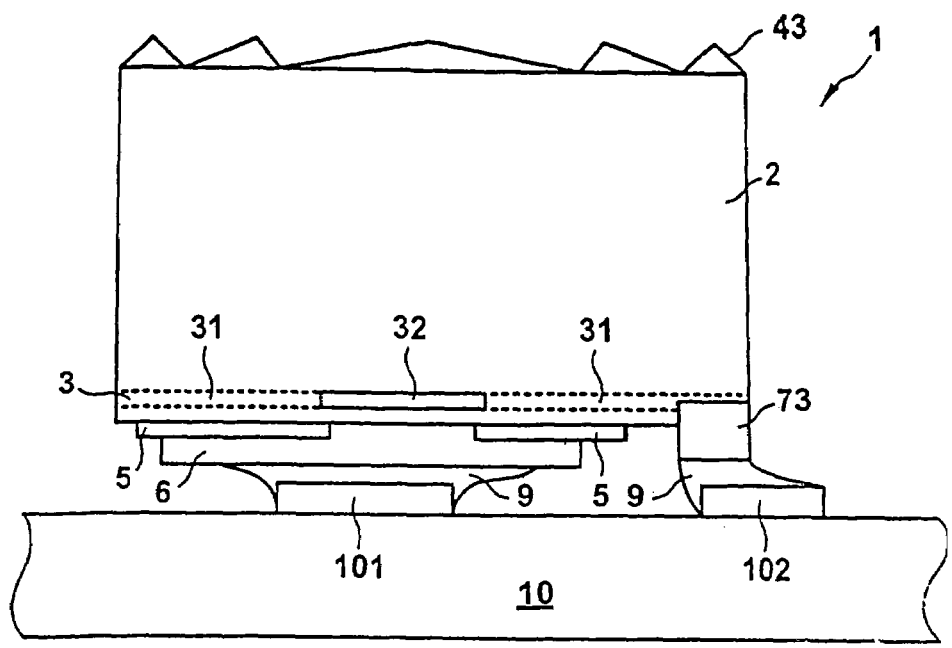
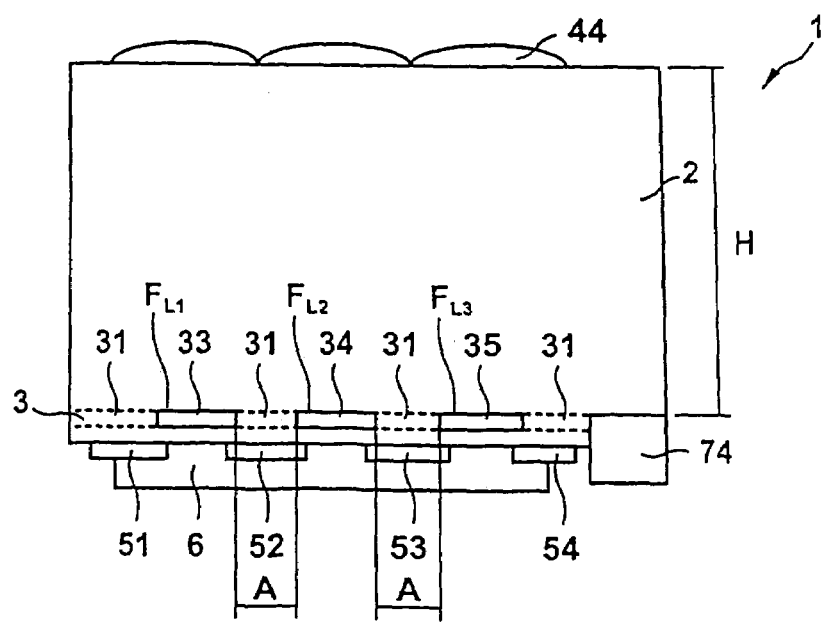

HIGH RADIANCE LED CHIP AND A METHOD FOR PRODUCING SAME

CROSS REFERENCE TO RELATED APPLICATIONS

This application is a divisional of U.S. application Ser. No. 10/258,154, filed Oct. 18, 2002, which is a National Phase application for PCT International Application No. PCT/DE01/01513, field Apr. 19, 2001, which claims priority to German Application No. DE 100 19 665.9, filed Apr. 19, 2000. The contents of the prior applications are incorporated herein by reference in their entirety.

FIELD OF THE INVENTION

The invention relates to a light-emitting diode chip and a fabrication method thereof.

BACKGROUND OF THE INVENTION

Semiconductor materials for light-emitting diode (LED) chips have a refractive index that in some cases is well above 3. The refractive index of the medium adjacent the chip in conventional LED components—usually air or plastic—is much lower. The associated sharp jump in refractive index at the interface between the LED chip and the adjacent medium makes for a comparatively small critical angle for total reflection, with the result that a large share of the electromagnetic radiation generated in the active region of the chip is reflected back into the chip by this interface.

For this reason, only a very small portion of the radiation generated in the active region is coupled directly out of the chip. In the case of conventional LED chips, the decoupling ratio for each planar decoupling surface is calculated at only a few percent.

To improve the decoupling of light from LED chips, U.S. Pat. No. 5,233,204 proposes a thick, transparent layer that is deposited epitaxially in addition to the light-generating layers and is intended to increase the percentage of light decoupled through the front of the chip.

Also known is the use of high-refractive, transparent casting compounds; however, these have failed to find widespread application because of cost considerations, among other factors. Moreover, the best casting compounds available heretofore have had a refractive index n of no more than 1.6, resulting in too large a jump at the decoupling surface of the light-emitting semiconductor component, and thus high reflection losses. In addition, the highly transparent casting compounds have undesirable chemical and mechanical properties, which also limits their large-scale industrial application.

The object of the invention is to provide an LED chip whose ratio of generated to decoupled radiation is improved over that of conventional chips and which can be mounted in conventional LED package formats. The invention is simultaneously directed to a method of fabricating such a chip that entails only slight additional technical expenditure compared to conventional methods of LED chip fabrication.

This object is accomplished by means of an LED chip and a method disclosed herein.

Advantageous improvements of the LED chip and of the method also follow.

By means of the invention, the radiation yield in an LED chip is increased by reducing the light-emitting region to an area smaller than the cross-sectional area of the LED chip. More than a 30% increase in decoupling is possible, compared to the usual implementation of the light-emitting area over the entire cross section of the LED chip.

Provided according to the invention are an LED chip comprising a radiation-emitting active region of lateral cross-sectional area $F_L$ and a radioparent window layer disposed after the radiation-emitting active region in the direction of radiation and having a refractive index $n_S$, and which, for purposes of the decoupling of light, has a lateral cross-sectional area $F_C$ and a decoupling surface adjacent a medium having the refractive index $n_M$, the cross-sectional area $F_L$ of the radiation-emitting active region being smaller than the cross-sectional area $F_C$ of the decoupling surface, such that the relation $$F_L \leq (n_M/n_S)^2 \cdot F_C$$

is fulfilled. Said cross-sectional area $F_C$ relates to the regions of the window layer that are available for or intended for the decoupling of light. The term "window layer" is to be understood herein both as a single layer and as a multilayer structure which as a whole performs the function of a window layer.

According to an especially preferred embodiment of the invention, it is provided that the light-emission-limiting system is implemented such that the flow of current within the LED chip, especially into and/or through the active layer, is limited to the light-emitting region. This makes it possible to limit the emission of light to a smaller region in accordance with the invention in an especially simple manner.

BRIEF SUMMARY OF THE INVENTION

In one embodiment of the invention, it is provided that the thickness H of the window layer is expressed by:

$$H < (n_S/n_M) \cdot \frac{1}{2} \cdot C$$

where C is the lateral cross-sectional length of the window layer or light exit surface, $n_S$ the refractive index of the material of the active layer or window layer, and $n_M$ the refractive index of the material adjacent the window layer. The advantage thus obtained is a further increase in the quantity of light decoupled.

The term "lateral cross-sectional length" is to be understood here and hereinbelow as the characteristic dimension of the cross-sectional area concerned. For example, in the case of a square area it is the length of a side, and in the case of a circular area it is the diameter. For areas of other shapes, the quantity taken as the lateral cross-sectional length can be a value falling between the maximum and minimum diameters passing through the centroid of the area.

The thickness H of the window layer adjacent the active layer is preferably expressed by:

$$H = (C - D) \cdot (2 \cdot (n_S/n_M))^{-1}$$

where C is the lateral cross-sectional length of the window layer, D the lateral cross-sectional length of the light-emitting region of the active layer, $n_S$ the refractive index of the window layer through which the radiation is to pass, and $n_M$ the refractive index of the material adjacent the window layer. To the level of this value, total reflection from the lateral faces of the window layer is largely avoided, and it is therefore possible for the generated radiation to be decoupled through the lateral faces.

According to a further preferred embodiment of the invention, the light-emitting region is composed of plural, regularly spaced light-emitting subregions (33 to 35) of the active layer (3), the total area $F_L$ of the light-emitting subregions being expressed by:

$$\sum_i F_{Li} = F_L \le (n_M/n_S) \cdot F_C$$

$F_C$ being the cross-sectional area or surface area of the window layer and thus the light exit surface, $F_{Li}$ the areas of the individual light-emitting subregions, $n_S$ the refractive index of the active layer or the window layer, and $n_M$ the refractive index of the material adjacent the window layer. Thus, the decoupling of light from the LED chip is optimized equally advantageously as in the case of a central light-emitting region in the active layer. Accordingly, the thickness H of the window layer is advantageously expressed by the equation:

$$H = p \cdot A$$

where A is the regular spacing of the individual light-emitting subregions and p a selectable factor between 0.5 and 5.

An optical device is advantageously provided by being realized on the surface of the window layer to focus the light exiting the LED chip. The shape of the exiting light beam can thus be defined and the decoupling further increased by an appropriate choice of material and shape.

A preferred embodiment of the invention provides that the optical device is realized by means of one or more preferably spherical lenses, the center of which lies over the centroid of the light-emitting region or over each of the centroids of the individual light-emitting subregions.

An equally preferred embodiment of the invention provides that the optical device is realized by means of one or more Fresnel lenses, the center of which lies over the centroid of the light-emitting region or over each of the centroids of the individual light-emitting subregions.

The optical device is preferably placed on or shaped from the surface of the window layer or is realized or shaped from the window layer itself.

In a further embodiment of the invention, the light-emission-limiting system takes the form of a delimitation of the active layer, in which case the luminosity of the active layer is restricted to the light-emitting region.

One advantageous embodiment of the invention is that the light-emission-limiting system takes the form of an insulating layer realized on or at the active layer and composed of a material that is at least partially opaque and/or to a limited extent translucent to the emitted light from the active layer. In this way, the active layer can extend as a continuous layer within a wafer that nevertheless contains many individual light-emitting semiconductor components, as has been customary heretofore.

A further advantageous embodiment of the invention provides that the light-emission-limiting system takes the form of an insulating layer that is realized on or at the active layer and between the active layer and a power supply, and that minimizes the supply of power or flow of current to and through the active layer in the regions outside the light-emitting region. Here again, the active layer can extend as a continuous layer within a wafer that nevertheless contains many individual light-emitting semiconductor components.

The insulating layer is advantageously a nonconductive oxide layer deposited on the side of the window layer opposite the light exit surface. The masking of the power supply can thus be achieved in a particularly simple and inexpensive manner. The oxide layer is advantageously produced by oxidizing the material that is already present.

In an equally advantageous manner, the light-emission-limiting system is constituted by configuring the power supply so that it is in electrically conductive contact with the active layer only in contact regions.

According to a preferred embodiment of the invention, a second power supply is realized by means of an electrical contact disposed on, but not fully covering, the light exit surface or the optical [device].

A bonding wire can be attached to the contact in the usual manner to effect contacting.

In an equally advantageous manner, a second power supply is realized by means of an electrical contact connected to the window layer between the active layer and the light exit surface.

In a further embodiment of the invention, a second power supply is realized by means of an electrical contact connected to the active layer.

The power supplies and/or the insulating layer are advantageously reflective of the emitted light. This further increases the luminous efficiency by preventing losses.

A reflecting device for the emitted light is advantageously realized in or on the window layer or active layer, on the side of the active layer facing away from the light exit surface. Again, this brings about a further increase in luminous efficiency by preventing losses. The reflecting device is accordingly a Bragg lattice.

In a further embodiment of the invention, the window layer and/or the optical device are provided, at least in part, with a covering that is transparent to the emitted light. The light-emitting semiconductor component is thereby protected against environmental influences. This permits external shaping to suit numerous applications.

The method according to the invention for fabricating a lens structure on the surface of an LED chip provides that on an outer surface of the LED component from which light is to exit or through which it is to pass, the lens structure is shaped from the LED component and into the external surface by means of a milling tool or an etching process.

A further preferred method step provides that a spherical lens or a Fresnel lens is fabricated as the lens structure.

A particularly advantageous method step provides that, with the use of an appropriately shaped device for singulating the LED components that are still in the wafer package, the lens structure is produced simultaneously with the singulation during the separation of the LED components.

Further advantages, particularities and advantageous improvements of the invention will emerge from the dependent claims.

The invention is described further hereinbelow with reference to the drawing. Individually, the schematic representations are:

BRIEF DESCRIPTION OF THE DRAWINGS

FIG. 1: a schematic cross-sectional diagram of a preferred embodiment of a light-emitting semiconductor diode comprising a light-emitting region in the active layer;

FIG. 1*a*: a schematic cross-sectional diagram of the exemplary embodiment of FIG. 1 in viewing direction X;

FIG. 3: a schematic cross-sectional diagram of a further preferred exemplary embodiment of a light-emitting semiconductor diode according to the invention, comprising a Fresnel lens structure;

FIG. 4: a schematic cross-sectional diagram of a further preferred exemplary embodiment of a light-emitting semiconductor diode according to the invention, comprising plural light-emitting subregions and a multi-lens structure.

In FIGS. 1 through 5 below, like reference numerals denote like or like-acting elements.

In FIG. 1, an LED chip 1 according to the invention is shown in cross section. The semiconductor component is composed of a window layer 2 that is radioparent to the emitted light; an active layer 3 emitting the light; an optical device, in the form of a lens 41, for shaping the exiting light beam; an insulating layer 5 as a light-emission-limiting device; and a first power supply 71 and a second power supply 6. Window layer 2 simultaneously serves as the substrate of LED chip 1.

DETAILED DESCRIPTION OF THE INVENTION

Figure 2:
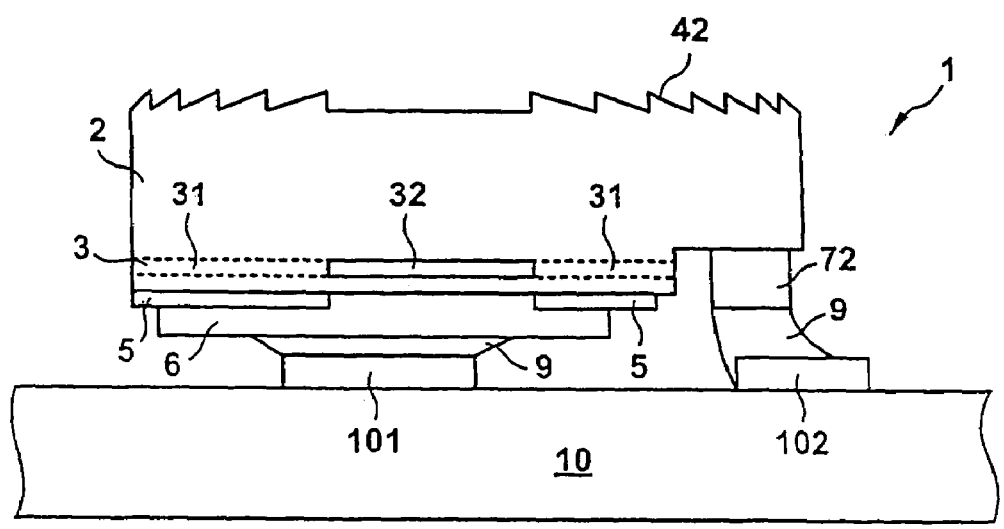
FIG. 2: a schematic cross-sectional diagram of a further preferred exemplary embodiment of a light-emitting semiconductor diode according to the invention, comprising a Fresnel lens structure.

The light-emitting region 32 of active layer 3 is limited and defined with respect to size and shape by masking of the insulating layer 5. The shape of the electrical insulation makes it possible for power supply 6, which is realized areally on the bottom side of light-emitting semiconductor component 1 disposed opposite light exit surface 8, to contact the chip or the active layer at those locations above which the light-emitting region 32 is situated. In the example, the material used for the insulating layer is an oxide layer [sic]. The power supply 6 can in this case be realized by means of metal deposited areally over the insulating layer 5. Thus, no current flows through the regions 31 of active layer 3 not intended for emission, and consequently no emission of light takes place in these regions. The second current entry is effected by means of first power supply 71, which is realized on the electrically conductive lens 41 in the form of an electrical contact ("pad") and to which a bonding wire can be attached in the usual manner.

The emitted light from the light-emitting region 32 of active layer 3, whose total area $F_L$ fulfills the already-cited condition $$F_L \leq (n_M/n_S)^2 \cdot F_C$$

passes through window layer 2 of refractive index $n_S$ and thickness H, H being expressed by:

$$H = (C - D) \cdot (2 \cdot (n_S/n_M))^{-1}$$

The emitted light is then coupled into the lens body 41 at light exit surface 8 and the exiting light beam is shaped according to the configuration of the lens.

For the thickness of the window layer one therefore has, for example in the case of a chip with a side length C=300 μm and $n_S/n_M$=3.5, in the ideal case, D=100 μm and H=30 μm. Correlatively, according to the condition $$H < (n_S/n_M) \cdot \frac{1}{2} \cdot C$$

H=500 μm, which represents the maximum permissible value.

The refractive index of window layer 2 and that of the material of lens body 41 are advantageously as similar as possible in order to prevent the aforementioned reflection losses. Ideally, the optical device is fabricated from the window layer 2 itself.

FIG. 1a shows the light-emitting semiconductor component 1 of FIG. 1 in viewing direction X. Here, the active layer 3 occupies the entire cross-sectional area $F_C$ (in the above calculation example, 90,000 μm²) of the semiconductor component. The light-emitting region 32 has the total area $F_L$ (in the above calculation example, 10,000 μm²).

FIG. 2 shows the cross section of a light-emitting semiconductor component 1 according to the invention, soldered to a board 10; here, power supplies 6 and 72 are both mounted on the underside of semiconductor component 1. This makes it easier to solder the light-emitting component 1 to soldering surfaces 101 and 102, realized on a board 10, by means of solder 9. As a result, it is feasible to produce light sources of so-called SMD [surface-mounted device] construction, in which the light-emitting semiconductor component 1 is barely larger than the chip itself. The active layer 3 is again realized areally and the light-emitting region 32 is defined by an insulating layer 5 serving as a light-emission-limiting device. In place of a lens 41 as in FIG. 1, here the optical device used to vary the exit light beam is a so-called Fresnel lens 42, which is realized by the method of the invention on the light exit surface of window layer 2 above light-emitting region 32 with the aid of high-speed milling tools or suitable etching techniques.

FIG. 3 shows a further soldered LED chip 1, illustrated in cross section, in which current entry is effected within the active layer 3 by means of a power supply 73. Here, the optical device is a post-embossed Fresnel lens 43.

FIG. 4 is a further cross-sectional diagram through an LED chip 1 comprising plural light-emitting regions 33 to 35, the total of whose individual areas $F_{Li}$ equals the total area $F_L$ of the light-emitting region, which again fulfills the above-cited condition for the ratio of $F_L$ to the surface area $F_C$ of the chip, and thus the area of the light exit surface.

In this arrangement, the height H of the window layer 2 through which the radiation is to pass should be selected as 0.5 to 5 times the spacing A between the individual light-emitting subregions 33 to 35. In the example shown, the optical device for varying the light-beam characteristic is composed of plural spherical lenses 44, the center of each of which is located over the centroid of a light-emitting subregion 33 to 35. Multiple Fresnel lenses can also be used here instead of lenses 44.

The window layer 2 can advantageously also be a grown epitaxial layer composed of a material that is transparent to the emitted light. Individual epitaxial layers or even the epitaxial starting material, often also referred to as the "substrate" in the narrower sense of epitaxial process technology, can be wholly or partially removed, for example etched away, in known processes. It is also feasible in terms of process technology to join different layers of material together mechanically and, above all, in an optically "gapless" manner, for example by anodic bonding or by pressing very planar surfaces onto one another.

Hence, the structures presented here can be fabricated by a wide variety of methods.

Figure 5:
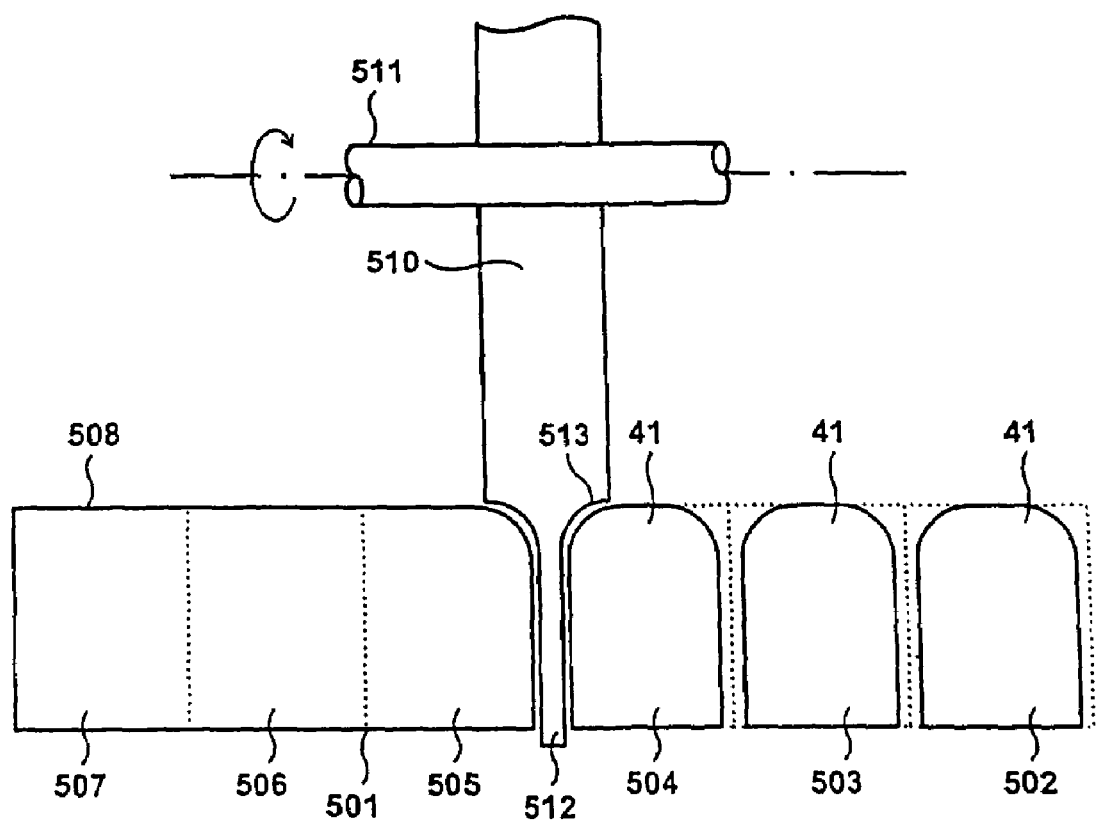
FIG. 5: a schematic cross-sectional diagram through a wafer comprising already-singulated and yet-to-be-singulated light-emitting semiconductor components and a saw blade used for this purpose.

FIG. 5, finally, is a schematic cross-sectional diagram through a wafer 501 comprising already-singulated LED chips 502 to 504 and yet-to-be singulated LED chips 505 to 507. The optical lenses 41 are fabricated in the surface 508 of the wafer 501 simultaneously with singulation, by means of the suitably shaped saw blade 510 rotating on the shaft 511.

Saw blade 510 comprises in cross section a thinner portion 512 tapering to a point and a flaring portion 513 that (negatively) corresponds to the lens shape to be produced. The saw blade can also be shaped so that the portion 512 tapering to a point is shorter, so that a multi-lens structure can be created in the surface of an LED chip.

The invention claimed is:

1. A method of fabricating a lens structure on the surface of a light-emitting component,
    wherein the light-emitting component comprises a radiation-emitting active region of lateral cross-sectional area $F_L$ and a radioparent window layer disposed after said radiation-emitting active region in the direction of radiation and having a refractive index $n_S$, and which, for purposes of the decoupling of light, has a lateral cross-sectional area $F_C$ and comprises a decoupling surface adjacent a medium having the refractive index $n_M$, the cross-sectional area $F_L$ of the radiation-emitting active region being smaller than the cross-sectional area $F_C$ of the decoupling surface, in accordance with the relation:

$$F_L \leq (n_m/n_S)^2 \cdot F_c$$

characterized in that on an outer surface of said light-emitting component through which light is intended to exit or pass, said lens structure is shaped by means of a milling or sawing tool or an etching process.

2. The method of fabricating a lens structure as recited in claim 1, characterized in that
    a spherical lens or a Fresnel lens is fabricated as said lens structure.

3. The method of fabricating a lens structure as recited in claim 1, characterized in that
    said light-emitting component is one of a plurality of individual light-emitting components in a wafer package, and wherein said lens structure is fabricated by means of a sawing tool or milling tool used for and during singulation of the individual light-emitting components in the wafer package.

4. The method of fabricating a lens structure as recited in claim 3, characterized in that
    said sawing tool or milling tool comprises a narrow portion for separating the individual semiconductor components from said wafer package and a portion whose shape corresponds to the shape of the lens to be fabricated and that serves to fabricate said lens.

* * * * *